US012756390B2

(12) United States Patent
Joos

(10) Patent No.: US 12,756,390 B2
(45) Date of Patent: Oct. 6, 2026

(54) SAFETY SYSTEM RESET DIAGNOSTIC BY RESET-DRIVER(S)

(71) Applicant: SEMICONDUCTOR COMPONENTS INDUSTRIES, LLC, Scottsdale, AZ (US)

(72) Inventor: Dieter Jozef Joos, Nieuwenrode (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 116 days.

(21) Appl. No.: 18/886,884

(22) Filed: Sep. 16, 2024

(65) Prior Publication Data

US 2025/0309891 A1 Oct. 2, 2025

Related U.S. Application Data

(60) Provisional application No. 63/570,133, filed on Mar. 26, 2024.

(51) Int. Cl.
*H03K 17/30* (2006.01)
*G01R 31/54* (2020.01)

(52) U.S. Cl.
CPC ........... *H03K 17/302* (2013.01); *G01R 31/54* (2020.01); *H03K 2217/0027* (2013.01); *H03K 2217/0081* (2013.01)

(58) Field of Classification Search
CPC ......... H03K 17/302; H03K 2217/0027; H03K 2217/0081; H03K 17/22; H03K 17/56; H03K 17/223; G01R 31/54; G01R 31/66; G01R 31/40; G01R 31/55; G01R 31/58; G01R 31/67; G01R 31/68
See application file for complete search history.

(56) References Cited

U.S. PATENT DOCUMENTS

2012/0166900 A1* 6/2012 Dimri ........... G01R 31/318541 714/E11.155
2020/0207374 A1 7/2020 Li
2024/0045426 A1 2/2024 Ditty et al.

FOREIGN PATENT DOCUMENTS

CN 112787645 A 5/2021

* cited by examiner

*Primary Examiner* — Jung Kim
(74) *Attorney, Agent, or Firm* — Quinn IP Law

(57) ABSTRACT

A device includes an open-drain driver, a comparator, and a digital logic circuit. The open-drain driver is operational to pull down and release a reset voltage on a reset line in response to an open drain enable signal. The comparator is operational to generate a comparison signal by comparing the reset voltage to an active threshold voltage. The digital logic circuit is operational to test a connection to the reset line. The test includes assertion of the open drain enable signal to pull down the reset voltage on the reset line, release of the open drain enable signal to float the reset voltage, and determine that the connection is one among good and failed in response to a change in the reset voltage relative to the active threshold voltage.

20 Claims, 8 Drawing Sheets

$V_{OL}$ = Max Output Voltage to Consider Logic LOW

SAFETY SYSTEM RESET DIAGNOSTIC BY RESET-DRIVER(S)

CROSS-REFERENCE TO RELATED APPLICATIONS

The present application claims the benefit of priority to U.S. Provisional Application No. 63/570,133 filed on Mar. 26, 2024, which is hereby incorporated by reference in its entirety for all purposes.

INTRODUCTION

Power Supply Systems (PSS) account for safety considerations are configured to supply datafusion Systems-on-a-Chip (SOC) or Data Processing Units (DPUs), for example, particularly in instances where used in vehicles like cars or trucks to meet an Auto Safety Integrity Level (ASIL-D) high-risk reduction classification. The ASIL-D classification corresponds to a larger ISO Standard, ISO 26262, and represents a highest automotive risk classification for functional safety criteria in electrical/electronic components/systems. In turn, datafusion SOCs or DPUs in vehicles are used to process raw sensor data (from sources on the vehicle such as Radar, Imaging sensors, LiDAR, Ultrasonic waves, and the like) and involve multiple power supply systems that power up and power down in particular sequences.

Accordingly, those skilled in the art continue with research and development efforts in the field of safety system reset diagnostic by reset-driver(s), usable in device(s) having single or multiple voltage rails controlling reset.

SUMMARY

A device and method for failure detection in a connection to a reset line is provided herein. A device has an open-drain driver, a comparator, and a digital logic circuit. The open-drain driver is operational to alternatively pull down a reset voltage on the reset line and release the reset voltage in response to an open drain enable signal generated by the digital logic circuit. The reset line utilizes a single pin on the device. The reset line may be biased to a high voltage by a load resistance external to the device. The reset line is generally connected to a processor circuit external to the device. The comparator is operational to generate a comparison signal by comparing the reset voltage to an active threshold voltage (sufficiently small to guarantee reset-state at the processor circuit is retained). The digital logic circuit is operational to test a connection to the reset line. The test involves asserting the open drain enable signal to command the open-drain driver to pull down the reset voltage on the reset line and subsequently releasing the open drain enable signal to place the open-drain driver is a high-impedance condition that allows the reset voltage to float. A time between releasing the reset line and again pulling down is sufficiently short to enable the processor circuit to retain a reset condition when intended to keep the reset. The connection between the device and the reset line is considered one among good and failed in response to a change in the floating reset voltage relative to the active threshold voltage prior to a short time (e.g., a few microseconds (us)) having elapsed.

Multiple devices may be implemented in a system/method. The devices are connected to the processor circuit through the same reset line. In various embodiments, the devices are rail regulators that provide electrical power to the processor circuit and test the connections to the reset line in a predetermined sequence. In other embodiments, the devices may be one or more voltage monitors that activate the open-drain drivers to pull down the reset line to disable the processor circuit while one or more monitored voltages are incorrect.

The above summary is not intended to represent every embodiment or aspect of the present disclosure. Rather, the foregoing summary exemplifies certain novel aspects and features as set forth herein. The above noted and other features and advantages of the present disclosure will be readily apparent from the following detailed description of representative embodiments and modes for carrying out the present disclosure when taken in connection with the accompanying drawings and the appended claims.

BRIEF DESCRIPTION OF THE DRAWINGS

The drawings described herein are for illustrative purposes only, are schematic in nature, and are intended to be exemplary rather than to limit the scope of the disclosure.

Figure 1:
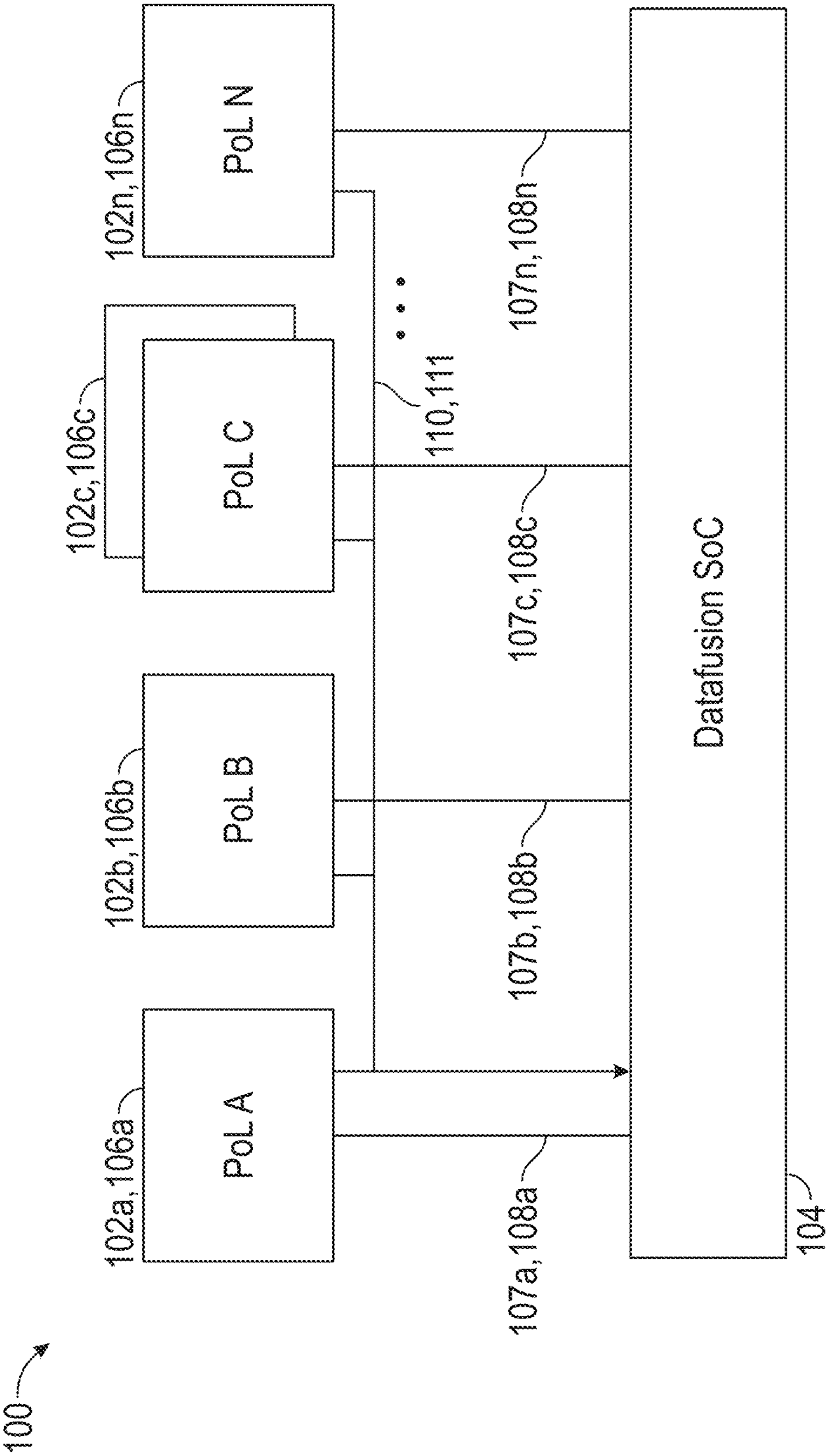
FIG. 1 is a schematic diagram of a system in accordance with one or more exemplary embodiments.

The present disclosure may be modified or embodied in alternative forms, with representative embodiments shown in the drawings and described in detail below. Inventive aspects of the present disclosure are not limited to the disclosed embodiments. Rather, the present disclosure is intended to cover alternatives falling within the scope of the disclosure as defined by the appended claims.

DETAILED DESCRIPTION

Multiple voltage rails generally exist in power supply systems and power various rail regulators. The rail regulators take a variety of forms during use, such as integrated circuits (IC), low-dropout (LDO) regulators, Point-of-Load (PoL or POL) converters, DC-to-DC converters, voltage monitors (Vmon), power management integrated circuits (PMIC), sequencers, and the like. Various embodiments of the invention may be described in terms of the rail regulator type POL, but is applicable to other types of rail regulators and other devices.

Referring to FIG. 1, a schematic diagram of an example system 100 is shown in accordance with one or more exemplary embodiments. The system 100 generally includes multiple rail regulators 102 (e.g., PoLs 102*a*-102*n*), one or more SOC 104 (one shown), and a communication device 114. Each POL 102*a*-102*n* includes a reset diagnostic circuit 106a-106n. Each POLs 102a-102n may present electrical power 107a-107n to the SOC 104 via a corresponding voltage rails 108a-108n. A reset line 110 forms a connection 111 between the PoLs 102a-102n and the SOC 104. The reset diagnostic circuit 106a-106n are coupled to a system error line 112.

During use, the PoLs 102a-102n may electrically power up to a "high" voltage value corresponding to an associated voltage rail value (e.g., 5 volts, 10 volts, etc.) and may power down to a "low" voltage value (e.g., 0 volts, ground, etc.). In various embodiments, the voltage rails 108a-108n may provide a common low voltage (or ground) for each of the PoLs 102a-102n. In other embodiments, the voltage rails 108a-108n may have different low voltages (or grounds). In some embodiments, the PoLs 102a-102n are devices that to not present voltages on the voltage rails 108a-108n.

The SOC 104 may implement one or more microcontroller units (MCU) or processor circuits. The SOC 104 (or processor circuit 104) communicates to other circuitry in the system 100 via the communication device 114. The SOC 104 may receive the electrical power 107a-107n from the PoLs 102a-102n via the voltage rails 108a-108n. In various embodiments, the SOC 104 may be in a reset condition while the reset line 110 is active low.

Each PoL 102a-102n may be configured to trigger or not trigger a reset of the reset line 110 for the SOC 104. Each POL 102a-102n drives a logic low condition on the reset line 110 until the corresponding voltage rail 108a-108n reaches a desired target range, at which time the PoL 102a-102n releases the reset line 110 to the logic high condition. The reset line 110 may be monitored by the reset diagnostic circuits 106a-106n so that each POL 102a-102n and the SOC 104 are executing a same strategy. Where all PoLs 102a-102n reach the respective target voltage ranges, the reset line 110 is released and the SOC 104 may exit a reset state. If, however, the reset line 110 releases before a last (or any) power supply voltage rail 108a-108n arrives at the respective target voltage range, the SOC 104 may experience one or more uncertain conditions, such as a condition attributed to a wrong decision, a wrong sensor being processed, or the like. The uncertain conditions may be considered a violation of an Auto Safety Integrity Level (ASIL-D) high-risk reduction classification and may result in unwanted conditions for the vehicle and or occupants therein. Therefore to meet the ASIL-D classification, detection of when the reset line 110 is released (whether too early or not able to enter reset when needed) and such may be attributed to mechanical or electrical failures, such as an open circuit as occurs with a package bond wire failure, a soldering failure, a crack in the printed circuit board (PCB) and the like. Monitoring the reset line 110 with an extra or dedicated pin on an IC, for example, adds economic, time, and manufacturing costs. Therefore, embodiments of the invention monitor the reset line 110 with the reset diagnostic circuits 106a-106n without implementing additional or dedicated pin(s) for the PoLs 102a-102n. Results of the diagnostics are presented on the system error line 112. The reset line 110 is often driven low by an open drain input/output (I/O) pull-down logic, but other embodiments are possible.

Figure 2:
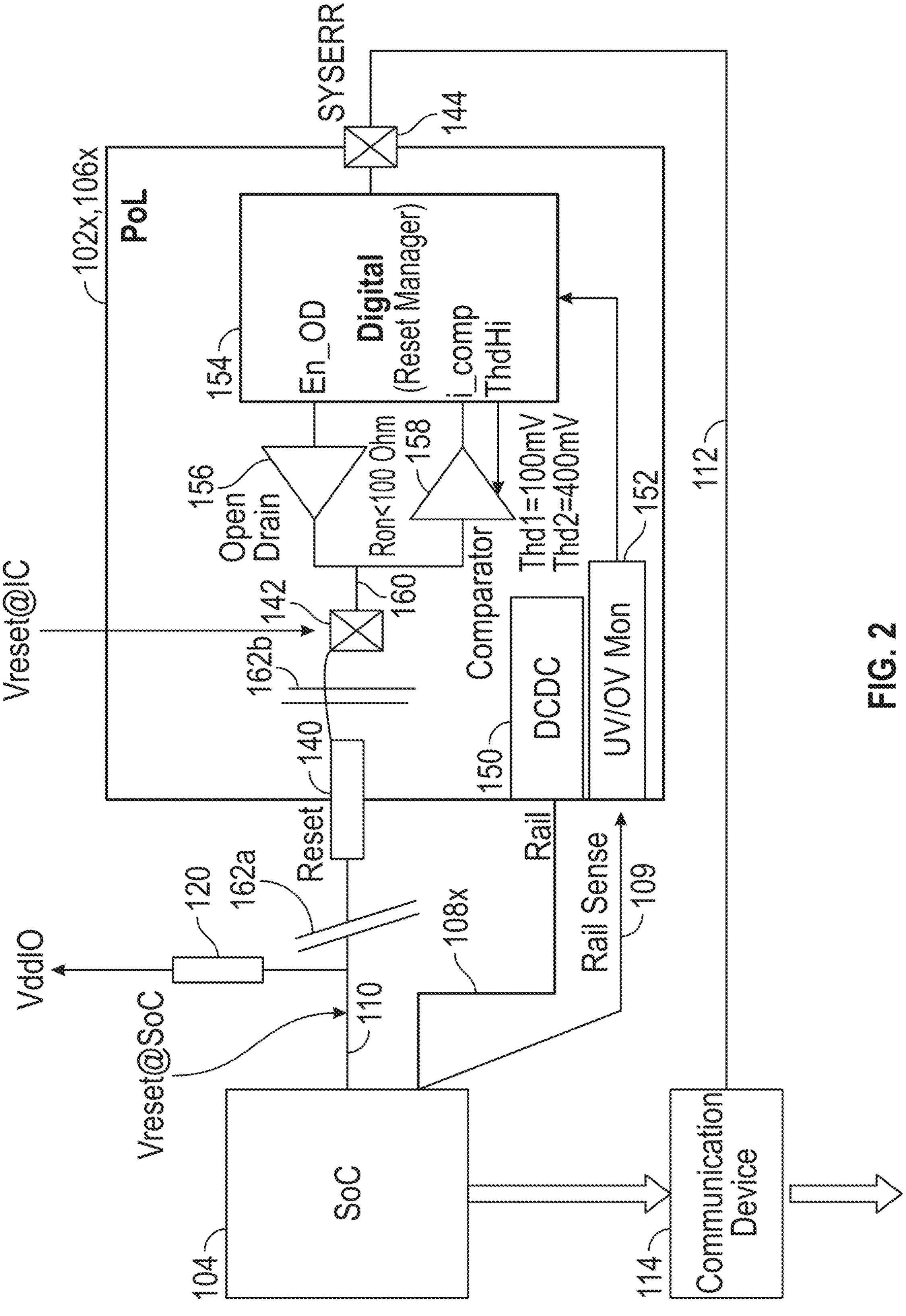
FIG. 2 is a schematic diagram of a reset diagnostic circuit in accordance with one or more exemplary embodiments.

Referring to FIG. 2, a schematic diagram of an example implementation of a reset diagnostic circuit is shown in accordance with one or more exemplary embodiments. The reset diagnostic circuit 106x is embedded in a POL 102x. The POL 102x may be representative of the PoLs 102a-102n. The reset diagnostic circuit 106x may be representative of the reset diagnostic circuits 106a-106n.

The reset diagnostic circuit 106x generally implements a single voltage rail configuration (or application) for each PoL 102a-102n. The reset diagnostic circuit 106x includes a single reset pin 140 coupled between the reset line 110 (Reset) and a reset pad 142, and an error interface 144 coupled to the system error line 112. The reset diagnostic circuit 106x further includes a DC-to-DC converter 150, an under-voltage/over-voltage (UV/OV) monitor 152, a digital logic circuit 154, an open-drain driver 156, and a comparator 158.

A load resistance 120 (e.g., a pull-up resistor) is coupled to the reset line 110 and is biased to pull up the reset line 110 to a power supply voltage VddIO. The reset line 110 is coupled to the SOC 104. The system error line 112 is coupled to a communication device 114.

The DC-to-DC converter 150 presents electrical power 107x to a voltage rail 108x.

The under-voltage/over-voltage monitor 152 implements an under-voltage and over-voltage monitoring input to the digital logic circuit 154. The under-voltage/over-voltage monitor 152 receives a rail sense voltage 109 from the voltage rail 108x. The under-voltage/over-voltage monitor 152 is operational to monitor a powering up sequence and powering down sequence on the voltage rail 108x to ascertain whether the rail voltage is (not) a too high voltage, (not) a too low voltage, or transitioning between the target voltage (=not too low and not too high) and the too low voltage. The under-voltage/over-voltage monitor 152 is also operational to determine whether the voltage rail 108x has stabilized at the target or desired voltage.

The digital logic circuit 154 is operational to determine when the reset line 110 should be pulled low to hold the SOC 104 in the reset state, and when the reset line 110 may be released to allow the SOC 104 to leave the reset state (e.g., enter an operating state). The digital logic circuit 154 includes an enable open drain port that presents an open drain enable (En_OD) signal, a comparator input port that receives a comparison (i_comp) signal, and a threshold control port that generates a threshold control (ThdHi) signal. To hold the SOC 104 in the reset state, the digital logic circuit 154 may control the open-drain driver 156 via the enable open drain enable signal (En_OD=1) to pull down a sense voltage 160 (e.g., Vreset@IC) at the reset pad 142, the reset pin 140, and the reset line 110. To release and allow the reset line 110 to float, the digital logic circuit 154 may control the open-drain driver 156 via the enable open drain signal (En_OD=0) to present an high impedance on the reset pad 142, the reset pin 140 and the reset line 110 thereby allowing the load resistance 120 to pull high the reset line 110 and the sense voltage 160 (without releasing the intended reset state at SoC 104).

The comparator 158 is operational to compare the sense voltage 160 at the reset pad 142 with an active threshold voltage. The active threshold voltage may be a first threshold voltage (Thd1) and/or a second threshold voltage (Thd2). Selection between the first threshold voltage Thd1 and the second threshold voltage Thd2 is controlled by the threshold control ThdHi signal from the digital logic circuit 154. In various embodiments, the first threshold voltage Thd1 may be approximately 100 millivolts (mV). The second threshold voltage Thd2 may be approximately 400 mV. Other threshold voltages may be implemented to meet the design criteria of a particular application. While the sense voltage 160 is above the active threshold voltage (Thd1 or Thd2), the comparator 158 may report a high condition to the digital logic circuit 154 via the comparator signal (i_comp=1). While the sense voltage 160 is pulled below the active threshold voltage (Thd1 or Thd2), the comparator 158 may report a low condition to the digital logic circuit 154 via the comparator signal (i_comp=0).

In the presence of one or more open faults 162*a*-162*b*, the open-drain driver 156 may be unable to pull the reset line 110 low. An example first open fault 162*a* may be an open circuit between the reset pin 140 and the reset line 110. An example second open fault 162*b* may be an open circuit between the reset pad 142 and the reset pin 140. Where an open fault 162*a* and/or 162*b* are detected, the digital logic circuit 154 may assert the system error line 112 to notify the communication device 114. While notified of the detected error, the communication device 114 may prevent the SOC 104 from reporting possibly erroneous data to other circuitry.

In operation, the UV/OV monitor 152 and the digital logic circuit 154 may monitor the voltage rail 108*x* via the rail sense voltage 109. As long as the voltage rail 108*x* is in the undervoltage condition, the reset diagnostic circuit 106*x* drives the reset line 110 low (e.g., En_OD=1) to reset the SOC 104.

The digital logic circuit 154 puts the open-drain driver 156 into a high impedance state (HiZ) (e.g., En_OD=0) approximately every 100 microseconds (us) (e.g., less than a fault tolerant time interval (FTTI)) until the comparator 158 determines that the sense voltage 160 reaches the first threshold voltage (Thd1=100 mV). When the first threshold voltage Thd1 is reached, the comparator 158 toggles the comparison i_comp signal at the digital logic circuit 154 to a logical high (or "1") value. In turn, the digital logic circuit 154 (or a fast analog loop) reactivates the open-drain driver 156 (e.g., En_OD=1) to guarantee the reset line 110 remains below a reset value (e.g., a logical low level or Vreset<approximately 400 mV). If the comparison i_comp signal remains low for more than approximately 10 us after the open-drain driver 156 is put in the high impedance state, the digital logic circuit 154 may conclude that a disconnect exists to the SOC 104 due to an open fault 162*a* and/or 162*b* (e.g., a broken bond wire, a bad soldering joint, or an open printed circuit board track) and reacts by driving a system error (SYSERR) signal on the system error line 112 low (e.g., SYSERR signal=low=system safe state).

The open-drain driver 156 may release relatively "slowly" from the pull-down state (e.g., Ron<100 ohms) to the high-impedance state in approximately 2 us to approximately 5 us. The slow release may be implemented by an RC filter on a gate of the open-drain driver 156, or by alternative methods.

In embodiments where the load resistance 120 is sufficiently small (e.g., produces a pull-up current of approximately 3 mA), the comparator 158 may already inform the digital logic circuit 154 that the first threshold voltage Thd1 has been reached without releasing the open-drain driver 156 (En_OD=1) and so there is contact between the open-drain driver 156 and the SOC 104. As long as the comparator 158 informs that the first threshold voltage Thd1 has already been reached, the digital logic circuit 154 may not release the open-drain driver 156 (e.g., keeps En_OD=1) to avoid a risk that the reset voltage would exceed a maximal logic low level.

The digital logic circuit 154 may control the open-drain driver 156 into the high impedance state at regular intervals (e.g., at least once every fault tolerant time interval) to detect the open faults 162*a* and/or 162*b* while guaranteeing that the reset line 110 remains below the logical low level (e.g., below 400 mV).

While the DC-to-DC converter 150 is disabled or when the DC-to-DC converter 150 just starts-up, and/or the voltage rail 108*x* is in the undervoltage condition, the PoL 102*x* may keep the reset line 110 low to maintain the SOC 104 in the reset condition (e.g., En_OD=1). The PoL 102*x* controls the open-drain driver 156 to pull the reset line 110 low (e.g., <400 mV) to avoid erroneous behavior from SOC 104, while the supply voltage is not (yet) out of the undervoltage condition. While the POL 102*x* tries to keep the SOC 104 in the reset condition, the reset line 110 is diagnosed to verify that the reset line 110 is still connected to open-drain driver 156 to guarantee that the SOC 104 is still in reset.

The diagnostics (e.g., detection+reaction (safe state)) happens in less than the fault tolerant time interval (e.g., approximately 1 ms) to cope with single point failures. While the digital logic circuit 154 tries to drive the reset line 110 low, the digital logic circuit 154 initially controls (e.g., EN_OD=1) the open-drain driver 156 and sets a commanded threshold in the threshold control ThdHi signal to instruct the comparator 158 to use the first threshold voltage Thd1=100 mV. Every short period less than the fault tolerant time interval (e.g., 500 us), the digital logic circuit 154 controls (e.g., EN_OD=0) the open-drain driver 156 into the high-impedance state until the comparator 158 detects that the sense voltage 160 on the reset pad 142 is above the first threshold voltage Thd1 (~100 mV). While the sense voltage 160 is above the detection first Thd1, the comparator 158 informs the digital logic circuit 154 (e.g., i_comp=1). Thereafter, the digital logic circuit 154 reactivates (e.g., En_OD=1) the open-drain driver 156 to pull the sense voltage 160 low to guarantee the reset line 110 in the reset state (e.g., <400 mV) is not violated during diagnostics. While the digital logic circuit 154 sets (e.g., En_OD=0) the open-drain driver 156 in high impedance state and the sense voltage 160 did not reach the first threshold voltage Thd1 (e.g., i_comp=0) before a timeout occurs (e.g., approximately 10 us), the digital logic circuit 154 triggers a safe state by asserting the system error line 112 low (e.g., SYSERR signal=low).

If the sense voltage 160 is already above the first threshold voltage Thd1 (e.g., i_comp=1) while the digital logic circuit 154 controls the open-drain driver 156 to pull down the sense voltage 160, the digital logic circuit 154 keeps the open-drain driver 156 in the pull-down state. The digital logic circuit 154 knows that the open-drain driver 156 is still connected to the reset line 110, but changes the threshold control ThdHi signal too high to instruct the comparator 158 to use the second threshold voltage Thd2 of 400 mV for a short time that checks if a state of the reset line 110 at the SOC 104 is still guaranteed. This mode generally checks if the Ron of the open-drain driver 156 is still sufficiently strong to keep the reset line 110 low (e.g., in the reset state).

If the digital logic circuit 154 detects a problem with the state of the reset line 110, digital logic circuit 154 reacts by asserting the system error line 112 into the safe state (e.g., SYSERR signal=low). The system error line 112 is the system safe state causes the communication device 114 to stop potentially improper communication to and from the SOC 104.

When the digital logic circuit 154 initiates a diagnostic test, the open-drain driver 156 transitions from a pull-down state impedance (e.g., Ron~100 Ohm) to the high-impedance state in approximately 2 us to approximately 5 us to cope with delays in the comparator 158 and in the digital logic circuit 154. The transition from the pull-down state to the high-impedance state guarantees sufficient time to react to the open-drain driver 156 transition. If the open-drain driver 156 is reactivated too slowly, the effective voltage on the reset line 110 may already be above the 400 mV target resulting in an error and a systematic fault.

Figure 3:
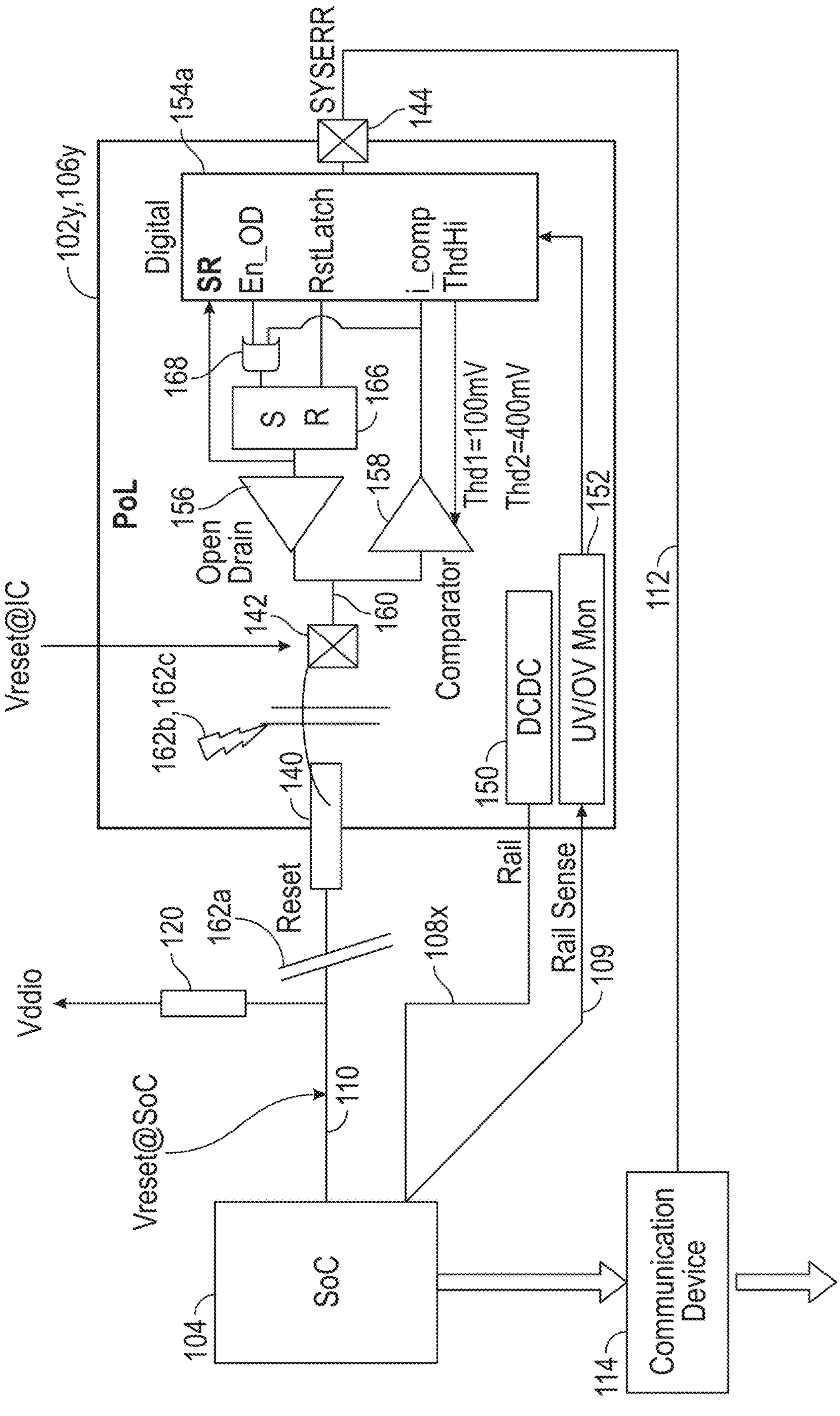
FIG. 3 is a schematic diagram of another reset diagnostic circuit in accordance with one or more exemplary embodiments.

Referring to FIG. 3, a schematic diagram of another example implementation on a reset diagnostic circuit is shown in accordance with one or more exemplary embodiments. The reset diagnostic circuit 106*y* is embedded in a POL 102*y*. The PoL 102*y* may be representative of the PoLs 102*a*-102*n*. The reset diagnostic circuit 106*y* may be representative of the reset diagnostic circuits 106*a*-106*n*.

The reset diagnostic circuit 106*y* generally implements a single voltage rail configuration (or application) for each POL 102*a*-102*n*. The reset diagnostic circuit 106*y* includes the reset pin 140 coupled between the reset line 110 and the reset pad 142, and the error interface 144 coupled to the system error line 112. The reset diagnostic circuit 106*y* further includes the DC-to-DC converter 150, the under-voltage/over-voltage (UV/OV) monitor 152, a digital logic circuit 154*a*, the open-drain driver 156, the comparator 158, an optional set-reset (SR) latch 166, and an optional Boolean OR gate 168.

The digital logic circuit 154*a* is a variation of the digital logic circuit 154. The digital logic circuit 154*a* includes a set/reset latch driven by a RstLatch signal at a reset latch port and an SR signal at a latch status port. Activation of the reset latch signal (RstLatch=1) and deactivation of the enable open drain signal (EN_OD=0) resets the SR latch 166. The reset of the SR latch 166 commands the open-drain driver 156 into the high-impedance state. Therefore, the floating reset line 110 is be pulled up by the load resistance 120. While the comparator 158 asserts the comparison i_comp signal and/or the enable open driver En_OD signal is asserted, the OR gate 168 is true and thus sets the SR latch 166. The set SR latch 166 activates the open-drain driver 156. The state of the SR latch 166/open-drain driver 156 is provided to the digital logic circuit 154*a* through the SR port.

Figure 4:
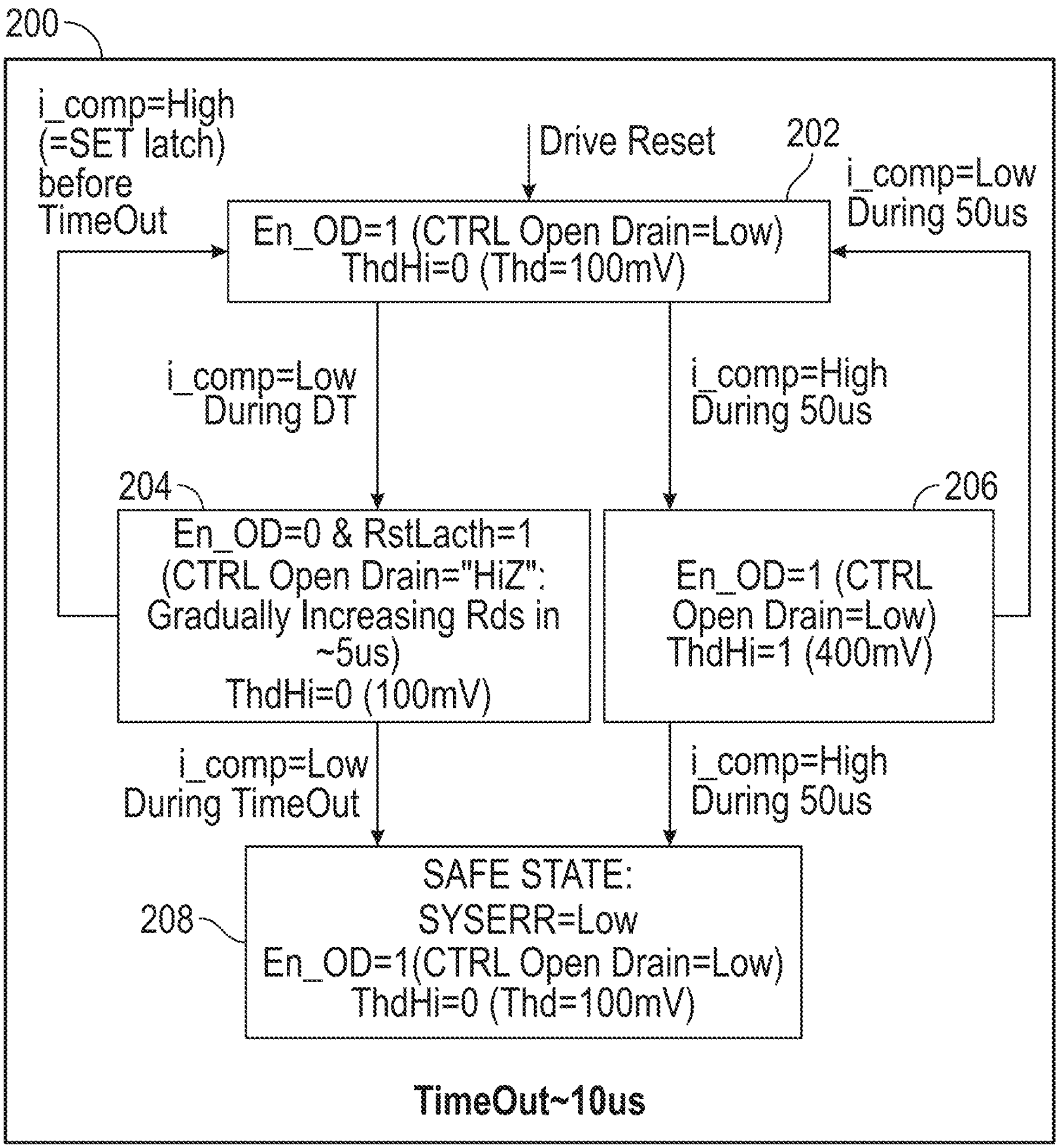
FIG. 4 is a schematic diagram of a finite state machine in accordance with one or more exemplary embodiments.

Referring to FIG. 4, a schematic diagram of an example finite state machine 200 within the POL is shown in accordance with one or more exemplary embodiments. The finite state machine 200 includes states 202 to 208, as illustrated.

Figure 5:
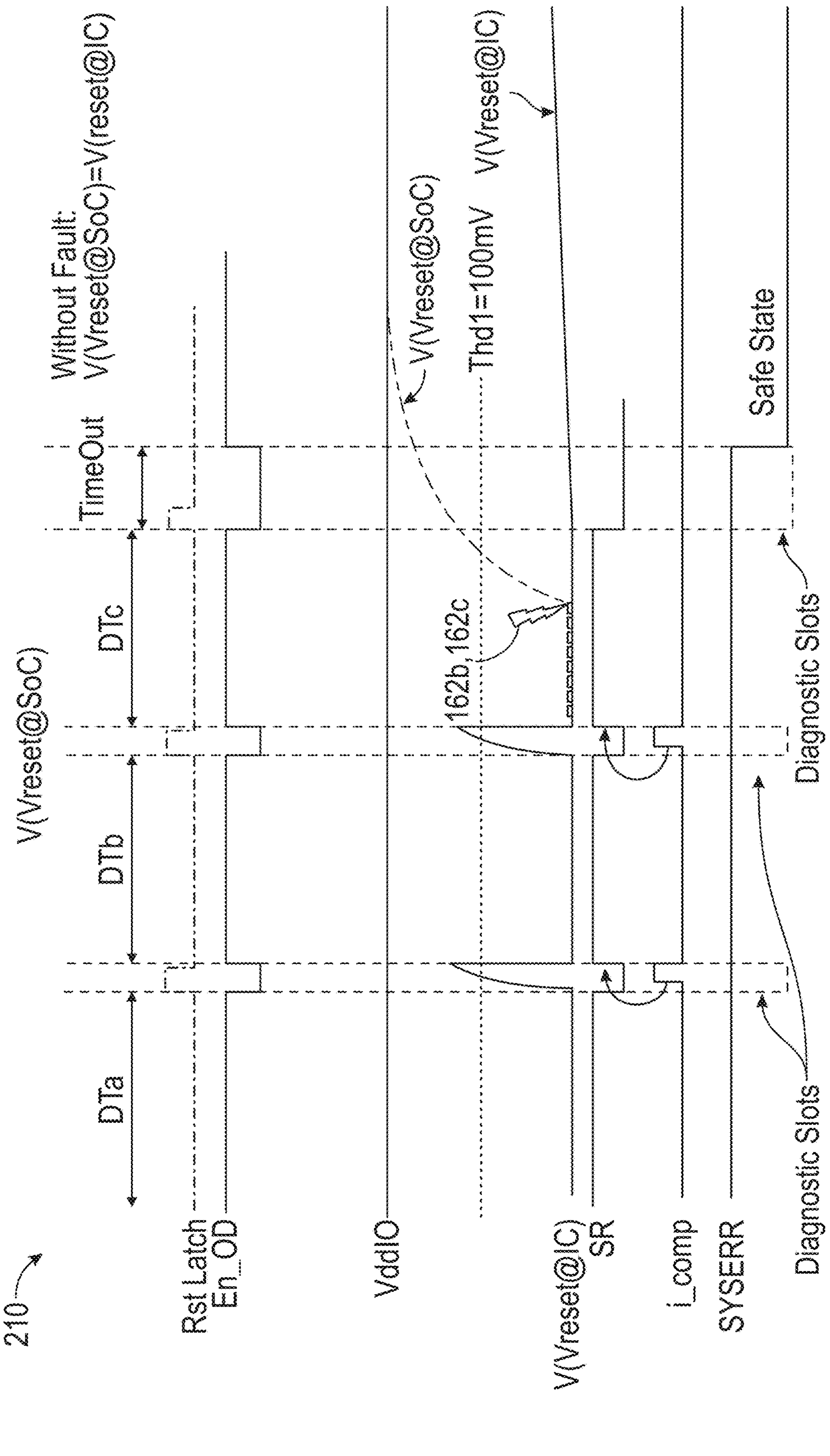
FIG. 5 is a timing diagram of signals in sequence of diagnostic tests in accordance with one or more exemplary embodiments.

Referring to FIG. 5, a timing diagram 210 of signals during an example sequence of diagnostic tests is shown in accordance with one or more exemplary embodiments. The diagram 210 has an X-axis that illustrates time, and a Y-axis that shows various signals.

In the state 202, a start of a first time (DTa) may be initialized with (i) the open drain enable EN_OD signal set to high such that the open-drain driver 156 pulls low and (ii) the threshold control ThdHi signal is set to low to signal the comparator 158 to use the first threshold voltage Thd1=100 mV. If the comparator 158 holds the comparison i_comp signal low during time DTa, the finite state machine 200 transitions to state 204 at the end of the time DTa. In the state 204, the connection to the reset line 110 is diagnosed. The low open drain enable En_OD signal and (where implemented) the high reset latch RstLatch signal control the open-drain driver 156 to gradually transition into the high-impedance state (e.g., approximately 5 us). If the reset line 110 is connected to the open-drain driver 156 (e.g., no fault), the sense voltage 160 (Vreset@IC) and the reset voltage (Vreset@SOC) are pulled up together by the load resistance 120. When the sense voltage 160 matches and/or exceeds the first threshold voltage Thd1 during the diagnostic slot, the comparator 158 sets the comparison i_comp signal to high. The digital logic circuit 154*a* subsequently sets the SR latch 166 and the finite state machine 200 returns to the state 202 to start a second time (DTb).

Where the sense voltage 160 remains above the first threshold voltage Thd1 during at least a predetermined time (e.g., 50 us) during DTa, the finite state machine 200 transitions from the state 202 to the state 206. In the state 206, the digital logic circuit 154*a* keeps the enable En_OD signal high such that the open-drain driver 156 keeps attempting to pull down the sense voltage 160. The digital logic circuit 154*a* may also generate the high threshold control ThdHi signal to use the second threshold voltage Thd2=400 mV. When i_comp remains low during a 50 us period while in the state 206, the finite state machine will know that the reset state is guaranteed at the SOC 104 since the sense voltage 160 (Vreset@IC) and the reset voltage Vreset@SOC are successfully pulled below the second threshold voltage Thd2 (400 mV). Therefore, the finite state machine 200 will switch back to the state 202 to restart another diagnostic cycle (as long as the Reset state at the SOC 104 is appropriate and no fault has happened). When i_comp goes high for more than 50 us while in the state 206, the finite state machine 200 will know that the reset state at the SOC 104 has failed and so the finite state machine 200 will transition to the safe state 208. In the absence of a fault, similar state transitions may occur during a second time (DTb).

By way of example, consider the open fault 162*b* to occur during a third time (DTc). If in the state 202, the load resistance 120 is no longer available to pull up the sense voltage 160 (Vreset@IC) at the comparator 158 (i_comp=Low) and the finite state machine 200 transitions to the state 204. At the end of the third time DTc, the digital logic circuit 154*a* may again test the sense voltage 160 (Vreset@IC). Due to the fault 162*b*, the floating sense voltage 160 remains below the first threshold voltage Thd1 and so the comparator 158 holds the comparison i_comp signal low. If i_comp remains low until the end of the time out period (e.g., ~10 us) and the reset voltage Vreset@SOC is allowed to continue to transition toward VddIO, the finite state machine 200 will transition to the safe state 208 and the digital logic circuit 154*a* pulls the SYSERR signal on the system error line 112 low to establish the safe state.

If in the state 202 when a stuck-at-high fault 162*c* occurs, the digital logic circuit 154*a* may sense that the open-drain driver 156*a* is unable to pull the sense voltage 160 (Vreset@IC) below the second threshold voltage Thd2 (400 mV) for 50 us (i_comp=High) and so the finite state machine 200 transitions to the state 206. In the state 206, the stuck-at-fault 162*c* continues to prevent the sense voltage Vreset@IC from being pulled low. Therefore, the finite state machine 200 transitions to the state 208 and the digital logic circuit 154*a* pulls the SYSERR signal on the system error line 112 low to establish the safe state.

Figure 6:
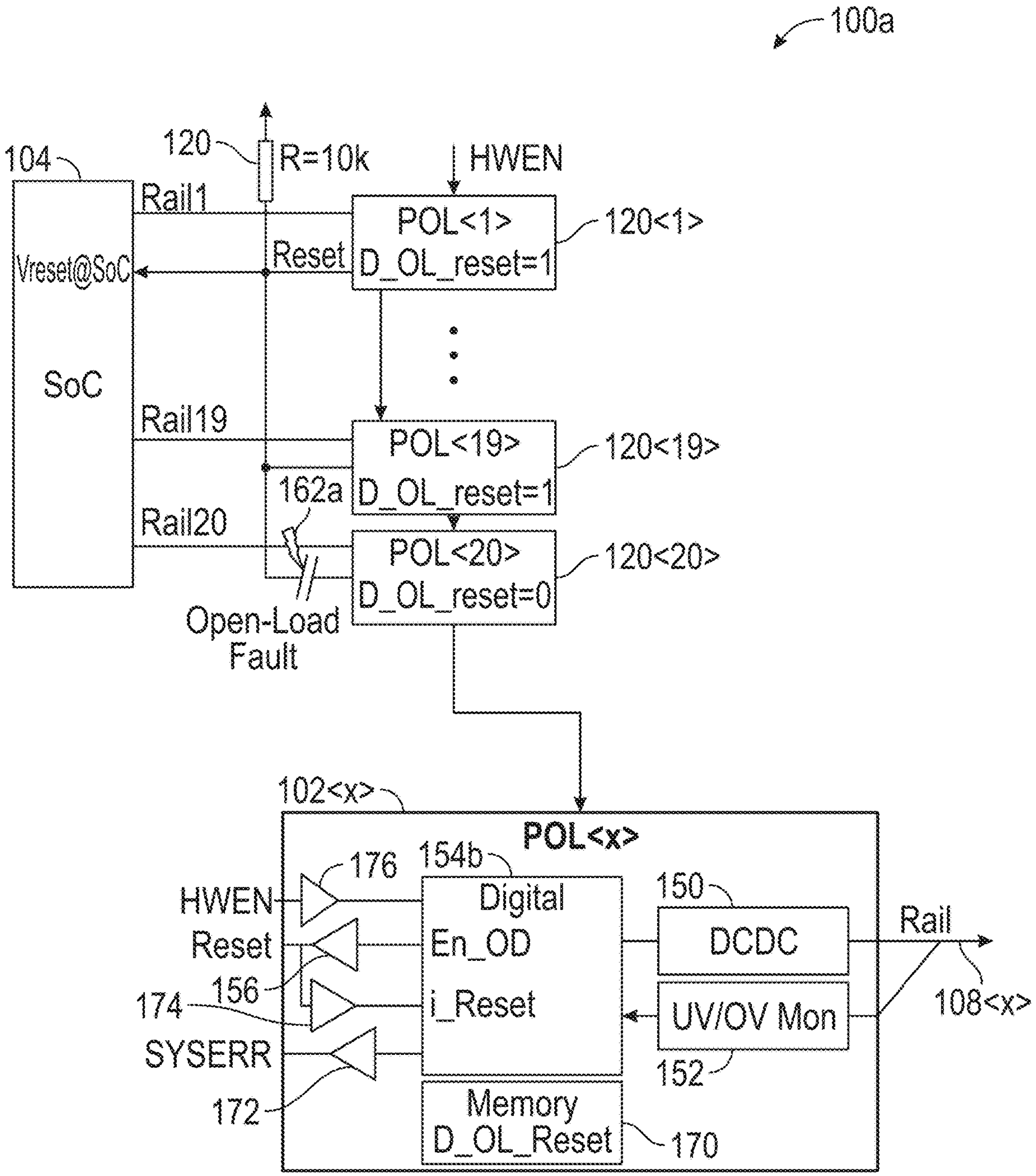
FIG. 6 is a schematic diagram of a system with multiple reset diagnostic circuits in accordance with one or more exemplary embodiments.

Referring to FIG. 6, a schematic diagram of an example implementation of a system 100*a* with multiple reset diagnostic circuits is shown in accordance with one or more exemplary embodiments. The system 100*a* may be a variation of the system 100. The system 100*a* generally includes reset diagnostic circuits 106<1> to 106<20> embedded in the PoLs 102<1> to 102<20>. Each POL 102<x> includes the DC-to-DC converter 150 the UV/OV monitor 152, a digital logic circuit 154*b*, the open-drain driver 156, the comparator 158, a memory 170, an input buffer 174, an output buffer 172, and another input buffer 176. The DC-to-DC converter 150 and the UV/OV monitor 152 may be coupled to a voltage rail 108<x>. The input buffer 176 may receive a hardware enable (HWEN) signal. The output buffer 172 may present the SYSERR signal. The input buffer 174 may be coupled to the reset line 110.

Figure 7:
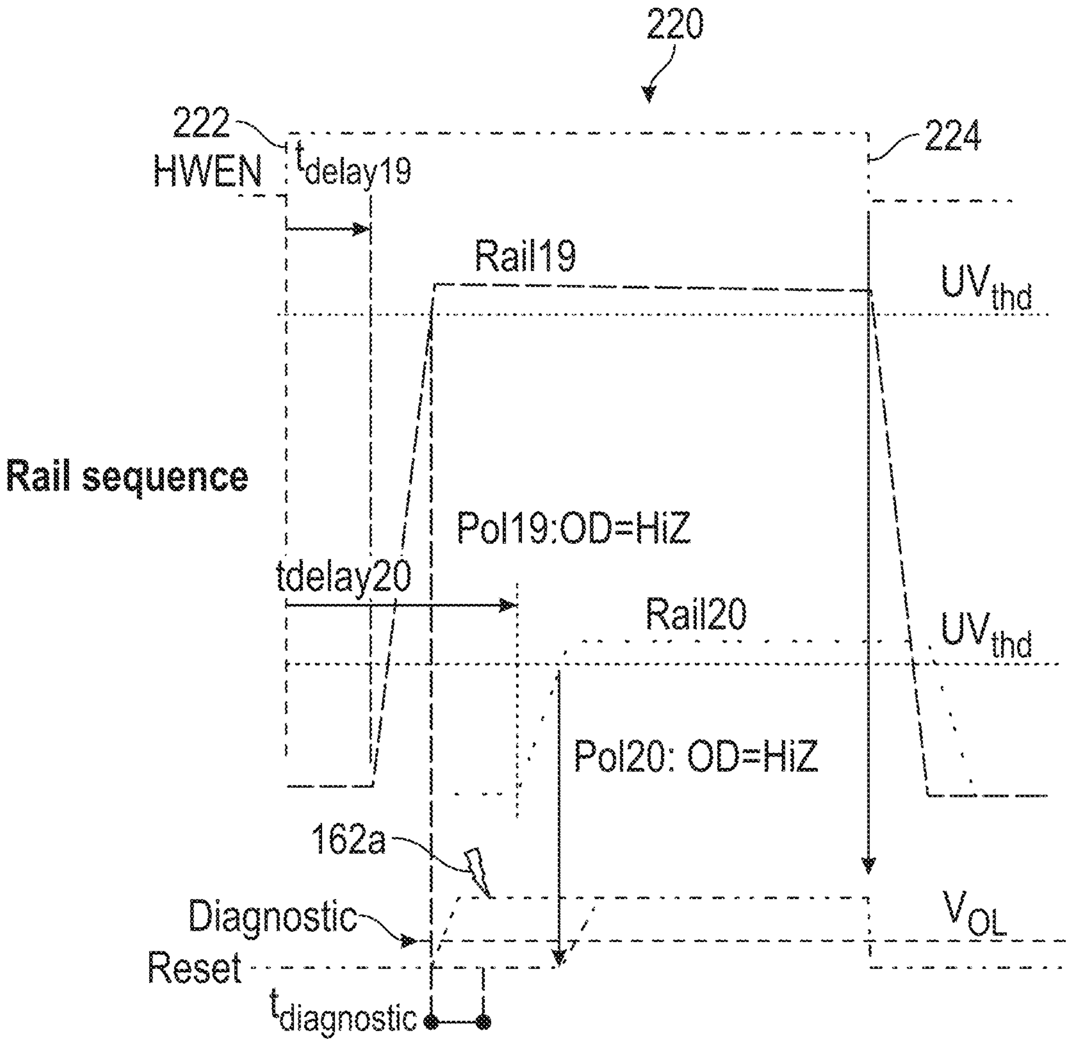
FIG. 7 is a timing diagram of signals during another sequence of diagnostic tests in accordance with one or more exemplary embodiments.

Referring to FIG. 7, a timing diagram 220 of signals during an example sequence of diagnostic tests is shown in accordance with one or more exemplary embodiments. The diagram 220 has an X-axis that illustrates time, and a Y-axis that shows various signals.

Figure 8:
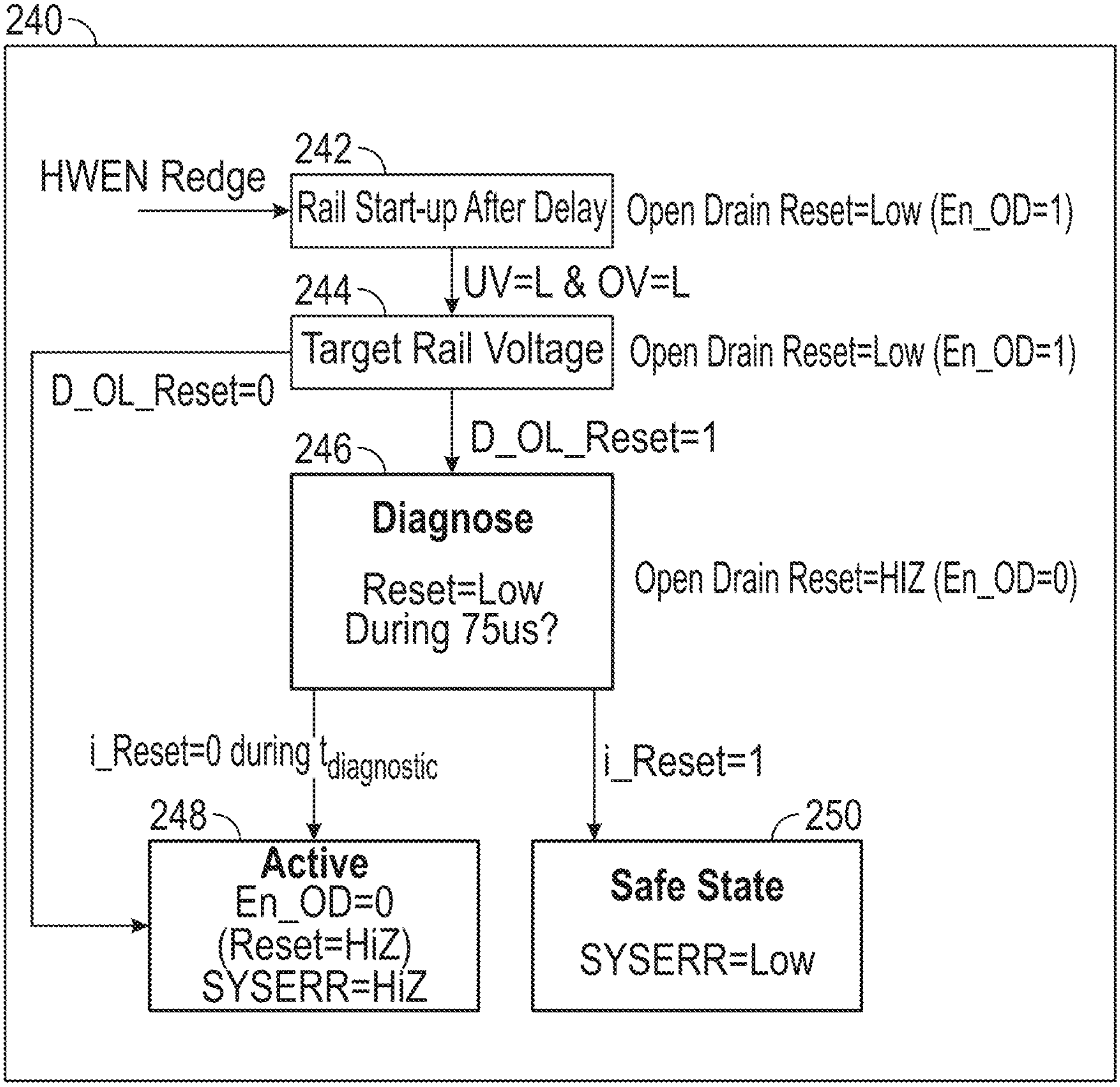
FIG. 8 is a schematic diagram of another finite sate machine in accordance with one or more exemplary embodiments.

Referring to FIG. 8 a schematic diagram of an example finite state machine 240 within the PoLs is shown in accordance with one or more exemplary embodiments. The finite state machine 240 includes states 242 and 246 to 250, and condition 244, as illustrated.

On a rising edge of the HWEN signal, each PoL<1> to Pol<20> includes an individually configured delay counter that starts defining an order in which the voltage rails 1 to 20 power-up in a rail sequence. The delay differences between sequential rails (Tdelay_X+1−Tdelay_X) may be set larger than the diagnostics time ($t_{diagnostic}$). The rail start-up occurs in the state 242.

When the voltage rail 108<x> ramps-up and gets above an under-voltage threshold (e.g., above UVthd) and remains below an over-voltage threshold (e.g., below OVthd), the finite state machine 240 transitions from the state 242 either to the diagnostic state 246 or to the active state 248, depending on a diagnostic memory bit (e.g. D_OL=Diagnostic Open Load on reset line) in the configuration memory 170 being respectively 1 or 0. The condition 244 generally indicates that the target voltage has been reached. The last PoL in the power-up sequence is normally the last PoL that keeps the reset line 110 low. All PoLs except the last POL in the power-up sequence will have the diagnostic memory bit D_OL enabled. When the diagnose state 246 is entered, the open-drain driver 156 transitions to the high-impedance condition (En_OD=0) to be able to confirm (diagnose) if the reset line 110 remains low for at least the diagnostic time $t_{diagnostic}$ to guarantee that the reset condition is still valid. In various embodiments, the diagnostic time may be approximately 75 us. For the PoLs performing diagnostics, the reset line 110 should-in absence of open faults—still be kept low by at least the last POL in the power-up sequence not performing diagnostics (e.g., D_OL_reset=0). If the reset line 110 does not remain low during the diagnostics (e.g., i_Reset=1), the finite state machine 240 transitions into the safe state 250. In the state 250, the SYSERR signal on the system error line 112 may be asserted low.

By way of example, consider a power-up sequence order of PoL<1>, <2>, <3>, . . . , and finally <20>. If PoL<20> is the last voltage rail to power-up, only in the PoL<20> has the diagnostic memory bit (e.g., a one-time programmable (OTP) bit) disabled (e.g., D_OL_reset=0). If PoL<20> has an open fault 162*a*, the open fault 162*a* is detected by the POL<19>. The remaining diagnostic memory bits in PoL<1> to PoL<19> are enabled (e.g., D_OL_reset=1). For a start of a power down sequence (initiated by the HWEN signal is low), there is no risk for a single point failure because all PoLs pull the reset line 110 low together. Multi-point faults would be appropriate to unintentionally release the reset line 110 to float high. A single memory bit in the memory 170 activates the diagnostic of reset open load directly after the open-drain driver 156 transitions to the high-impedance condition to confirm that the reset line 110 remains low for at least approximately 75 us.

Diagnoses of the reset line 110 is maintained during the voltage rail power-up sequence and is handled by multiple different integrated circuits forming a power supply system. A different order part number (OPN) is used for the last voltage rail in the power up sequence. The reset line 110 may be pulled low (e.g., below the logical low voltage $V_{OL}$) at the rising edge 222 of the HWEN signal and kept low until all the PoLs have powered up. Thereafter, the reset line 110 may be pulled up by the load resistance 120 (e.g., a 10,000 Ohm resistor). At a falling edge 224 of the HWEN signal, the reset line 110 may be brought low.

These and other benefits of the present teachings will be readily appreciated by those skilled in the art now having the benefit of the foregoing disclosure.

While several modes for carrying out the many aspects of the present teachings have been described in detail, those familiar with the art to which these teachings relate will recognize various alternative aspects for practicing the present teachings that are within the scope of the appended claims. The above description and accompanying drawings are illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A device comprising:

an open-drain driver operational to pull down a reset voltage on a reset line and release the reset voltage in response to an open drain enable signal;

a comparator coupled to the open-drain driver and operational to generate a comparison signal by comparing the reset voltage to an active threshold voltage; and a digital logic circuit coupled to the open-drain driver, coupled to the comparator, and operational to test a connection to the reset line, wherein the test includes:

assertion of the open drain enable signal to command the open-drain driver to pull down the reset voltage on the reset line;

release of the open drain enable signal to place the open-drain driver in a high-impedance condition that allows the reset voltage to float; and determine that the connection is one among good and failed in response to a change in the reset voltage relative to the active threshold voltage.

2. The device according to claim 1, wherein:

the digital logic circuit is further operational to assert a system error signal in response to detection of the failure.

3. The device according to claim 1, wherein:

the digital logic circuit is further operational to generate a threshold control signal that selects the active threshold voltage between a first threshold voltage and a second threshold voltage used by the comparator.

4. The device according to claim 3, wherein:

the first threshold voltage is approximately 100 millivolts; and the second threshold voltage is approximately 400 millivolts.

5. The device according to claim 1, further comprising:

a set-reset latch coupled between the digital logic circuit and the open-drain driver and operational to buffer the open drain enable signal.

6. The device according to claim 5, wherein:
the digital logic circuit is further operational to reset the set-reset latch.

7. The device according to claim 1, further comprising:
a DC-to-DC converter coupled to a voltage rail and operational to generate electrical power on the voltage rail.

8. The device according to claim 1, further comprising:
a single pin that connects the reset line to the open-drain driver.

9. A method for failure detection in a connection to a reset line comprising:
asserting an open drain enable signal with a digital logic circuit;
pulling down a reset voltage on a reset line with an open-drain driver in response to the asserting of the open drain enable signal;
releasing the open drain enable signal with the digital logic circuit;
placing the open-drain driver in a high-impedance condition that allows the reset voltage to float in response to the releasing of the open drain enable signal;
generating a comparison signal by comparing the reset voltage to an active threshold voltage with a comparator coupled to the open-drain driver; and
determining that the connection is one among good and failed in response to a change in the reset voltage relative to an active threshold voltage, wherein the digital logic circuit is coupled to the open-drain driver and the comparator.

10. The method according to claim 9, further comprising:
asserting a system error signal with the digital logic circuit in response to detection of the failure.

11. The method according to claim 9, further comprising
generating a threshold control signal with the digital logic circuit that selects the active threshold voltage between a first threshold voltage and a second threshold voltage.

12. The method according to claim 11, wherein:
the first threshold voltage is approximately 100 millivolts; and
the second threshold voltage is approximately 400 millivolts.

13. The method according to claim 9, further comprising:
buffering the open drain enable signal with a set-reset latch.

14. The method according to claim 13, further comprising:
resetting the set-reset latch with the digital logic circuit.

15. The method according to claim 9, further comprising:
generating electrical power with a DC-to-DC converter; and
presenting the electrical power to a processor circuit, wherein the processor circuit is connected to the reset line.

16. The method according to claim 9, further comprising:
connecting the reset line to the open-drain driver through a single pin.

17. The method according to claim 15, further comprising:
monitoring the electrical power with an under-voltage/over-voltage monitor; and
driving the reset line low while the electrical power is in an undervoltage condition.

18. The method according to claim 9, further comprising:
pulling up the reset line with a load resistor.

19. The device according to claim 7, further comprising:
an under-voltage/over-voltage monitor operational to monitor the electrical power, wherein
the reset line is driven low while the electrical power is in an undervoltage condition.

20. The device according to claim 1, further comprising:
a load resistor wired to pull up the reset line.

* * * * *